United States Patent [19]

Hovekamp

[11] Patent Number: 4,530,306
[45] Date of Patent: Jul. 23, 1985

[54] COATING DEVICE FOR PLATES

[75] Inventor: John C. Hovekamp, North Canton, Ohio

[73] Assignee: Graphic Enterprises of Ohio, Inc., Canton, Ohio

[21] Appl. No.: 568,920

[22] Filed: Jan. 6, 1984

[51] Int. Cl.³ ............................................. B05C 1/02
[52] U.S. Cl. .................................. 118/669; 118/681;
118/236; 118/247; 118/262; 118/50
[58] Field of Search ............... 118/681, 680, 247, 236,
118/50, 262, 669

[56] References Cited

U.S. PATENT DOCUMENTS

| | | | |
|---|---|---|---|
| 567,742 | 9/1896 | Galicher | 118/247 X |
| 2,167,430 | 7/1939 | Booty et al. | 118/681 |
| 2,613,393 | 10/1952 | Flanagan | 118/61 X |
| 2,614,522 | 10/1952 | Snyder | 118/681 |
| 3,861,351 | 1/1975 | Bonit et al. | 118/236 X |
| 4,006,704 | 2/1977 | Perondi | 118/247 X |
| 4,282,275 | 8/1981 | Werner | 118/262 X |
| 4,363,288 | 12/1982 | Fara | 118/262 X |

Primary Examiner—John P. McIntosh
Attorney, Agent, or Firm—Michael Sand Co.

[57] ABSTRACT

A device which provides an economical means for coating offset plates on one side with a solvent based coating. An offset plate is advanced along a feed table by a suction belt toward a roller assembly consisting of a fountain roller, a metering roller, a coating roller and an impression roller. The fountain roller transfers liquid from a supply of coating liquid to the metering roller which transfers a predetermined amount of liquid to a moving plate by the coating roller. The impression roller forces the plate into engagement with the coating roller. A photoelectric sensor detects the leading edge of the plate as it moves through the roller assembly and moves the impression roller toward the coating roller to begin the coating application. The sensor detects the trailing edge of the moving plate and retracts the impression roller to stop the coating application. The speed of the feed belt, discharge belt and rollers are synchronized to accurately control the thickness of the coating applied to the plate. An air dryer and exhaust system exhausts any harmful vapors from the coating area. A latch mechanism relieves the coating pressure between the rollers when the coating device is not in use and the lengths of the rollers are staggered to eliminate an edge bead from being formed and transferred to the plate.

22 Claims, 18 Drawing Figures

COATING DEVICE FOR PLATES

TECHNICAL FIELD

The invention relates to a device for coating plates and other flat media, and in particular to offset plates used in the printing industry. More particularly, the invention relates to a device for applying photosensitive resists to an offset plates on one side, in which the coating application is controlled by a sensor which detects the passage of the leading and trailing edges of the plate as it moves toward a coating roller assembly.

BACKGROUND ART

The usual procedure for producing printed materials and primarily for producing newspaper print in which each page includes several columns and photographs and different printed articles, in contrast to the printed usual page of a book, involves making a paste-up in which the actual printed articles and photographs are individually arranged on and secured to a grid board in the desired location and arrangement as would appear the printed page. This paste-up as it is referred to in the printing industry, is then photographed by a camera which makes a negative of the paste-up. This negative then is registered with a negative working plate, usually in a vacuum frame for exposure, and the exposed plate is processed and ready for press. These negative working plates are usually extremely precision sheets of special metal having a finely controlled thickness and coating on one side thereof. Although these negative working plates are used and perform satisfactory in the printing industry they are relatively expensive due to the coating that is applied thereto.

It would be desirable for ease of production and economy to use a positive working plate in contrast to the currently used negative plates. Positive plates would eliminate the photographing of the paste-up board prior to registering it with a positive working plate. However, prior coaters used for coating positive plates for use in the printing industry are expensive due to the precision rollers and bearing arrangements therefor and the difficulty of controlling the coating applied since a very precision coating is required on the plates. Although positive working offset plates have been developed for use in the printing industry they are used mainly for high quality printing such as books, in contrast to use in a lower quality printing of the type used for newspapers due to the cost of the plates.

Accordingly, the need has existed particularly for use in the printing industry for a coating device which can apply a precision coating to a positive-working offset plate intended for use primarily in the newspaper industry. There is no known coating device of which I am aware which achieves these results.

DISCLOSURE OF THE INVENTION

Objectives and advantages of the invention include providing an improved coating device for plates and particularly for applying a photosensitive resist to one side of an offset plate to form a positive working plate, in which the precise coating thickness applied to the plate is accomplished by an improved roller assembly which enables a predetermined thickness of coating to be easily maintained, and in which the coating is applied to only one side of the plate within predetermined and accurately controlled portions expensive due to the coating that is applied thereto.

It would be desirable for ease of production and economy to use a positive working plate in contrast to the currently used photographic negatives and subsequent netative plates. Positive plates would eliminate the photographing of the paste-up board prior to registering it with a positive working plate. However, prior coaters used for coating plates, both positive and negative, for use in the printing industry are expensive due to the precision rollers and bearing arrangements therefor and the difficulty of controlling the coating applied since a very precision coating is required on the plates especially when applying a solvent base coating. Although positive and negative coated working offset plates have been developed for use in the printing industry they are used mainly for high quality printing such as books, in contrast to use in a lower quality printing of the type used for newspapers due to the cost of the plates.

Accordingly, the need has existed for an economical device which can be used directly in the plant of a printing company for applying a precision solvent base coating to form both positive and negative working offset plates at a considerably lower cost per plate than if the plates were purchased from an outside vendor of such coated plates.

DISCLOSURE OF THE INVENTION

Objectives and advantages of the invention include providing an improved coating device for plates and particularly for applying a photosensitive resist to one side of an offset plate to form a positive working plate, in which the precise coating thickness applied to the plate is accomplished by an improved roller assembly which enables a predetermined thickness of coating to be easily maintained, and in which the coating is applied to only one side of the plate within predetermined and accurately controlled portions of the plate. Another object of the invention is to provide such an improved coating device in which the plate is transported by a vacuum belt system in a steady, uniform and even manner throughout the entire coating operation, and in which the plate back remains clean from any of the coating that is applied to the opposite side thereof enabling the plates to be easily stacked one upon the other at the end of the coating operation after being dried by an automatic drying and air evacuation means which also removes any harmful vapors from the coating area.

Still another objective of the invention is to provide such a coating device in which the coating system may be used for solvent based positive working plate coatings, in which clean-up is a relatively simple and easy task requiring only a few minutes, and in which the thickness of the applied coating can be adjusted accurately and easily.

Another objective is to provide such a coating device which uses an engraved roller formed with a plurality of wells in the outer surface for transferring the desired amount of coating liquid to a coating roller for application to the moving plate, in which the pressure between the various rollers of the roller assembly can be regulated as well as the running speed thereof to easily adjust the amount of coating liquid transferred from a supply reservoir to the plate, in which the rollers are staggered in longitudinal length to eliminate the formation of an objectional edge bead on the coated plate, and in which the various rollers furthermore alternate in relative hardness as to their outer surface from hard and soft to enable a better controlled coating to be applied to the plate.

A further objective of the invention is to provide such an improved coating device in which the amount of coating pressure effected by an impression roller which forces the plate into contact with the coating roller is controlled by an electromechanical linkage, which in addition to regulating the coating pressure insures that the coating is applied only to the plate and is not transferred to the impression roller thereby eliminating any coating material from being carried to the underside or uncoated side of the plate with the resulting cleanup problems; and in which an adjustable latching mechanism is provided which enables the pressure between the rollers to be removed when the coating device is idle and which enables the rollers to be brought back into the same pressure engagement and relationship with each other that existed prior to removal of the pressure engagement without requiring any additional adjustments. Still another objective is to provide such a device in which the plate feed and discharge tables may be pivotally mounted on the roller assembly mounting mechanism from a horizontal working position to a vertical position to achieve a space savings when the coating device is not in use and to enable the coating device to be transported easily through doorways and narrow hallways and passages.

Another objective of the invention is to provide such a coating device in which the speed of the plate feed belt and discharge belt are synchoronized with the speed of the rollers of the coating mechanism to increase the accuracy of the coating as to thickness and location on the moving plate. Still another objective of the invention is to provide sensing means in the path of the moving plate upstream of the coating mechanism which actuates the electromechanical linkage of the impression roller to accurately determine the position on the plate where the impression roller is actuated to start and stop the coating operation. This will insure that the coating is applied only on one side of the plate and at the desired starting and ending positions without being transferred to the impression roller, and in which these starting and stopping positions can be regulated easily by adjusting time delays actuated by the plate sensing means which controls the movement of the impression roller.

These objectives and advantages are obtained by the improved coating device for plates of the invention, the general nature of which may be stated as including: coating roller means adapted to communicate with a supply of coating liquid for transferring said coating liquid to one side of an offset plate; drive means for rotatably driving the coating roller means for transferring said coating liquid to one side of an offset plate; feed means for delivering an offset plate into the coating roller means to be coated by said roller means; and sensor means for detecting the position of an offset plate with respect to the coating roller means as it is being moved by the feed means, and for controlling the coating roller means drive means in response to said position of the offset plate to ensure that the coating liquid is applied to only one side of said plate.

BRIEF DESCRIPTION OF THE DRAWINGS

A preferred embodiment of the invention, illustrative of the best mode in which applicant has contemplated applying the principles, is set forth in the following description and shown in the accompanying drawings and is particularly and distinctly pointed out and set forth in the appended claims.

BEST MODE FOR CARRYING OUT THE INVENTION

Figure 1:
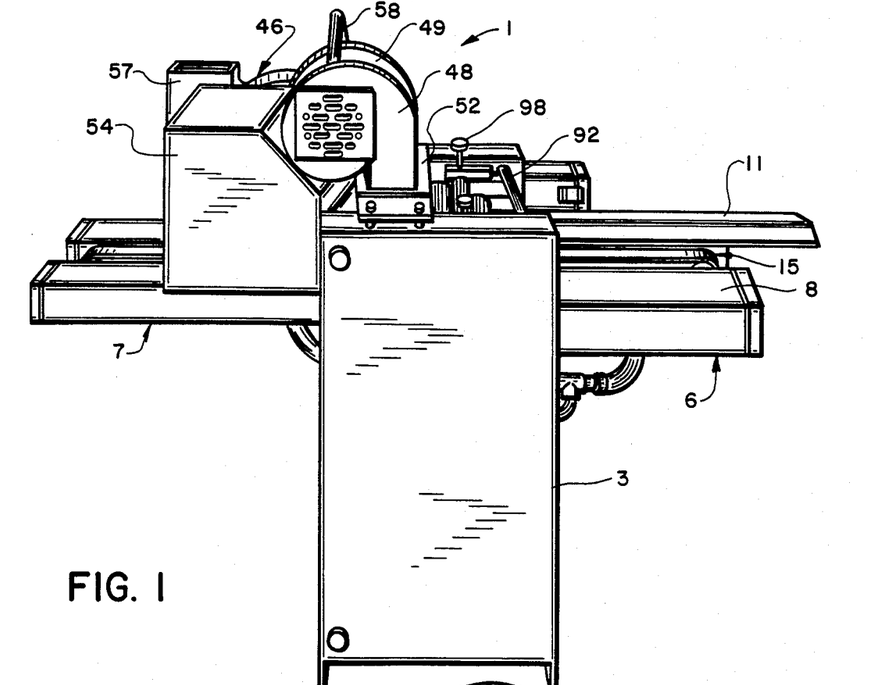
FIG. 1 is a side perspective view of the improved offset plate coating device.
Figure 2:
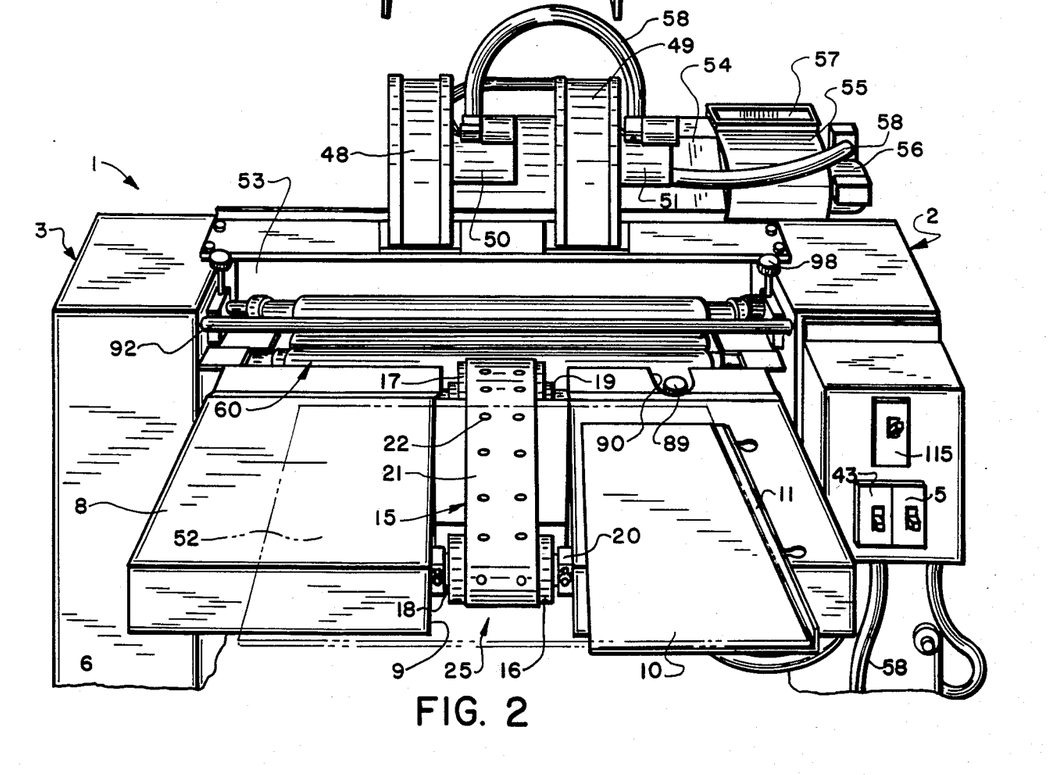
FIG. 2 is an enlarged fragmentary front perspective view of the coating device shown in FIG. 1.
Figure 3:
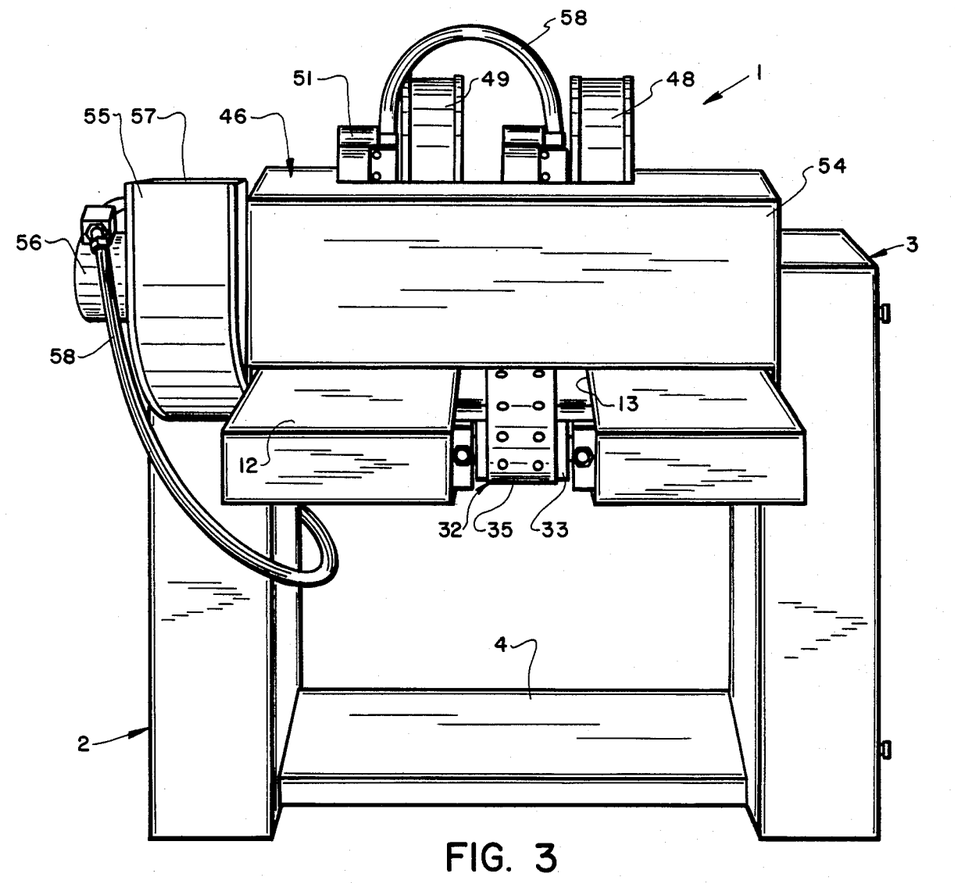
FIG. 3 is a perspective rear view of the coating device shown in FIG. 2.

The improved coating device is indicated generally at 1, and is shown particularly in FIGS. 1, 2 and 3. Device 1 includes a pair of spaced vertically extending end cabinets indicated generally at 2 and 3, which form the base or mounting platform of the coating device. A horizontally extending reinforcing platform 4 extends between the lower ends of cabinets 2 and 3. A plate feed table 6 is mounted at the front end of coater 1 with a discharge table 7 being located at the discharge end.

Feed table 6 (FIG. 2) includes a horizontal slide surface 8 which extends between end cabinets 2 and 3 and is formed with a central longitudinally extending opening 9. A plate guide 10 is adjustably mounted on one side of feed table 6 adjacent end cabinet 2. Discharge table 7 (FIG. 3) also includes a horizontal top surface 12 which extends transversely between end cabinets 2 and 3 and is formed with a central opening 13 extending horizontally longitudinally throughout the length of surface 12.

Figure 4:
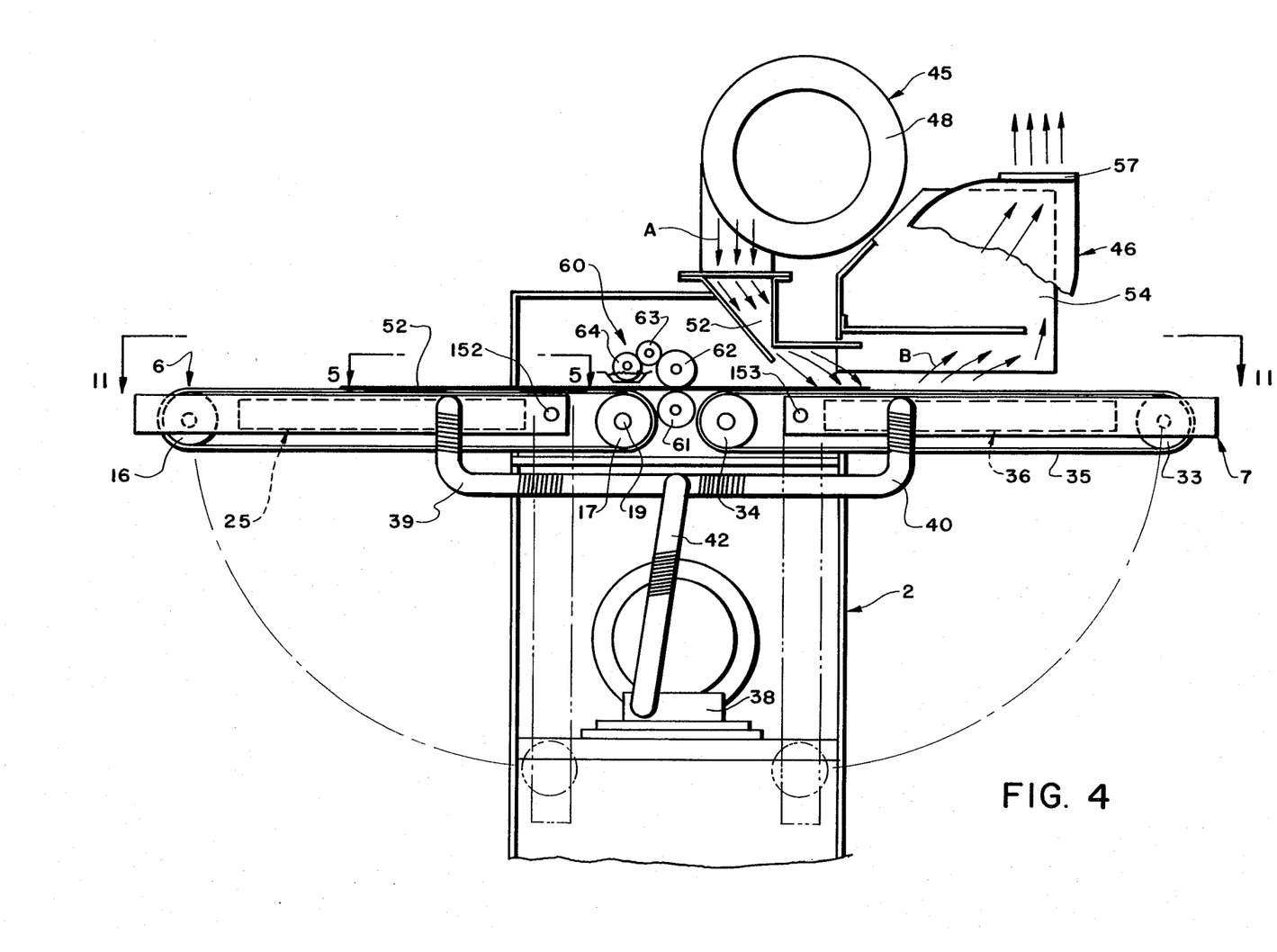
FIG. 4 is an enlarged fragmentary side view similar to FIG. 1 of the improved coating device, with parts broken away and in section, showing the plate feed and discharge belts and suction system therefor, and the plate dryer and exhaust systems.
Figures 5, 6:
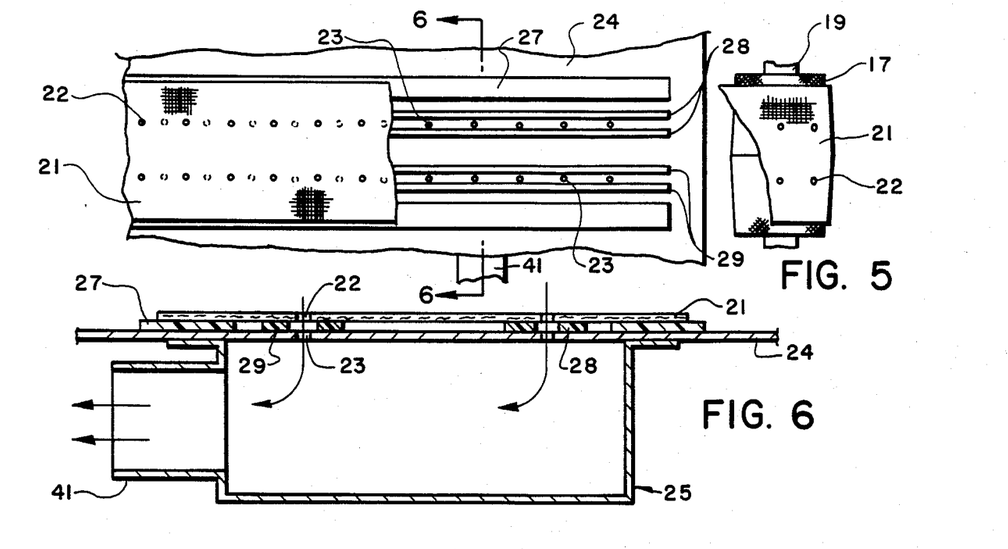
FIG. 5 is an enlarged fragmentary view, with portions broken away, showing the plate feed, belt looking in the direction of arrows 5—5, FIG. 4.
FIG. 6 is an enlarged fragmentary sectional view taken on line 6—6, FIG. 5.

The plate feed means indicated generally at 15, is mounted on feed table 6 and is located generally within feed table opening 9. Feed means 15 includes a pair of rotatably mounted crown pulleys or rolls 16 and 17 mounted generally adjacent the front and rear ends of feed table 6 (FIGS. 2, 4 and 5). Pulley rolls 16 and 17 are rotatably mounted on shafts 18 and 19 respectively which are supported in brackets 20 mounted on table 6 adjacent each side of table opening 9. An endless vacuum belt 21 is rotatably mounted on and extends between pulley rolls 16 and 17. Belt 21 has a plurality of spaced holes 22 which align with two rows of spaced holes 23 (FIGS. 5 and 6) which are formed in top wall 24 of a suction chamber which is indicated generally at 25, and which extend generally throughout the length of table opening 9. Feed belt 21 is slidably supported on a pair of longitudinally extending end strips 27 formed of a low friction material such as nylon which are mounted on top wall 24 of suction chamber 25 with holes 23 lying between spaced pairs of similar low friction strips 28 and 29.

Referring to FIGS. 3 and 4, a plate discharge means indicated generally at 32, includes a pair of pulley rolls 33 and 34 with an endless vacuum belt 35 being rotatably mounted on and extending between said rolls in a similar manner to that of plate feed means 15. Vacuum belt 35 is slidably supported on and located above a suction chamber 36 having low friction strips mounted thereon (not shown) in a similar manner as strips 27-29 of vacuum belt 21. Suction chambers 25 and 36 are connected to a suction pump 38 (FIG. 4) by a pair of branch lines 39 and 40 respectively, which are connected to their respective suction chambers through inlet tubes 41 and a main suction line 42. Suction motor 38 preferably is controlled by a switch 43 mounted on the front panel of end cabinet 2 (FIG. 2). Feed belt pulley roll 17 and discharge pulley roll 34 are power driven as described in greater detail below to provide the force for rotating the respective vacuum belts 21 and 35, with pulley rolls 16 and 33 being freely rotatably mounted.

Referring to FIG. 4 a dryer mechanism and exhaust system indicated generally at 45 and 46 respectively, are located downstream of the plate feed means. Dryer system 45 includes a pair of impinging air blowers 48 and 49 (FIG. 2) which are driven by electric motors 50 and 51 respectively, which produce currents of air through a baffle chamber 52 that extends transversely across discharge table 7 between end cabinets 2 and 3. Baffle chamber 53 directs a curtain of air indicated by arrows A (FIG. 4), against an offset plate 52 at a location immediately after a coating liquid has been applied to one side thereof in a manner described in greater detail below.

Immediately adjacent dryer system 45 on the downstream side thereof is exhaust system 46 which includes an exhaust hood 54 that is located above and which extends transversely across discharge table 7. Hood 54 communicates with an exhaust blower 55 rotated by an electric motor 56 and is mounted at one end of hood 54 on end cabinet 2 (FIG. 3). Exhaust system 46 enables any harmful vapors to be drawn immediately from the coating and drying area indicated by arrows B in FIG. 4 up through an exhaust duct 57 which is connected to an exhaust line or filter arrangement (not shown) to prevent such vapors from being discharged into the surrounding atmosphere adjacent the coating device. Dryer motors 50 and 51 and exhaust motor 56 are connected through electric lines 58 to a control switch 59 mounted on end cabinet 2 adjacent vacuum motor switch 43 (FIG. 2).

In accordance with another of the main features of the invention, an improved coating roller assembly indicated generally at 60, is mounted on and extends between end cabinets 2 and 3 (FIGS. 2 and 11) for coating a moving offset plate 52 on one side thereof. Roller assembly 60 includes an impression roller 61, a coating roller 62, a metering roller 63 and a fountain roller 64. Rollers 61–64 are mounted on end panels 66 and 67 of end cabinets 2 and 3 as shown particularly in FIGS. 11–14 with the drive mechanism therefor being shown particularly in FIG. 14.

Figure 12:
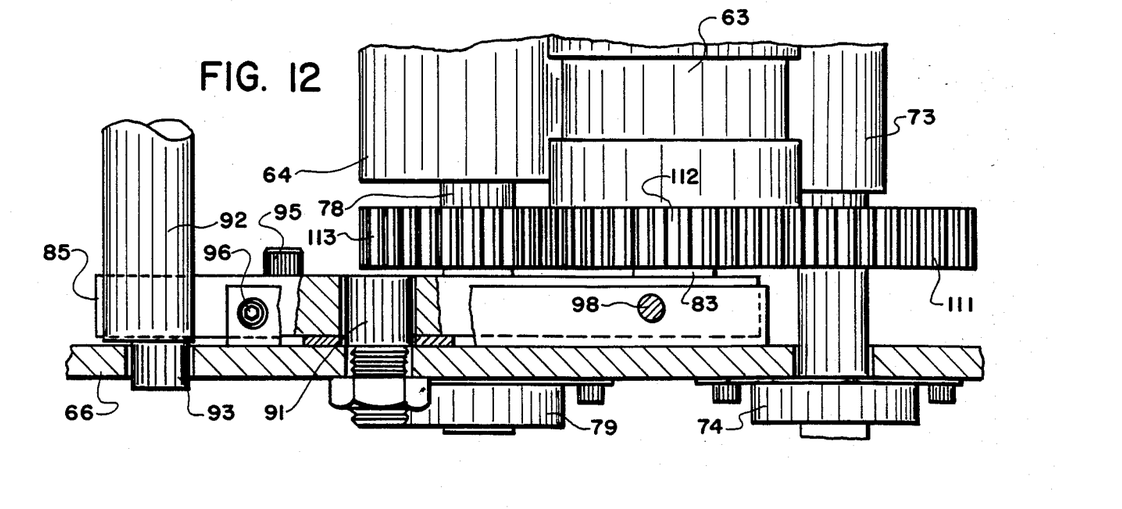
FIG. 12 is an enlarged fragmentary view with portions broken away and in section of the coating roller assembly.
Figure 13:
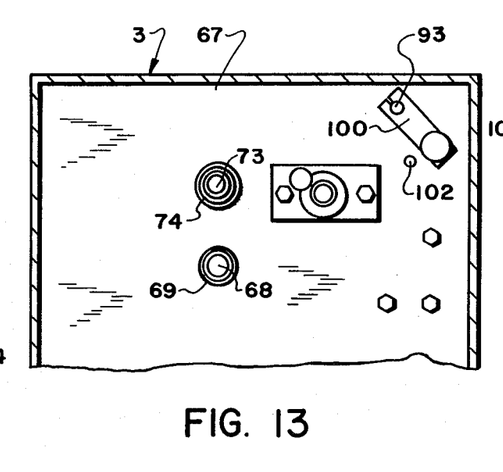
FIG. 13 is an enlarged fragmentary sectional view taken on line 13—13, FIG. 11.
Figure 14:
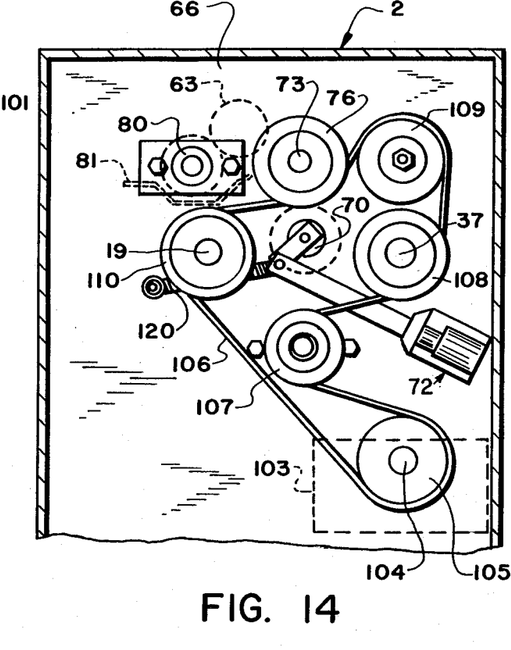
FIG. 14 is an enlarged fragmentary sectional view taken on line 14—14, FIG. 11.

Impression roller 61 includes a shaft 68 which is eccentrically mounted on panel end 67 (FIG. 13) by a bearing 69 and on panel 66 by a bearing 70. An electromechanical coating actuation and control mechanism indicated generally at 72 (FIGS. 7, 8 and 14) the details of which are described below, is operatively connected to impression shaft 68 for moving impression roller 61 toward and away from pressure engagement with coating roller 62. Coating roller 62 includes a stepped shaft 73 which is rotatably mounted by bearings 74 on end panels 66 and 67 (FIGS. 12, 13 and 14). A drive pulley 76 is mounted on an extended end of shaft 73 (FIG. 14). Fountain roller 64 includes a shaft 78 which is mounted on end plate 67 by a bearing 79 and mounted on end plate 66 by a bearing 80.

Figure 15:
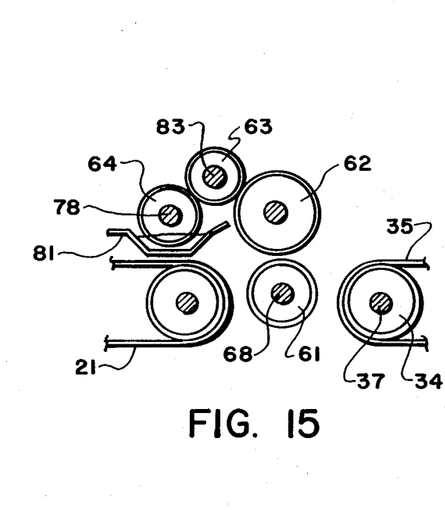
FIG. 15 is a reduced fragmentary sectional view taken on line 15—15, FIG. 11.

A reservoir 81 (FIGS. 11 and 15) is mounted between end panels 66 and 67 for holding a supply of coating liquid with fountain roller 64 being partially submerged in the liquid as shown in FIG. 15. The liquid in reservoir 81 may be maintained and circulated by a feed pump (not shown) or by a gravity feed system or other type of liquid makeup arrangement.

Figure 9:
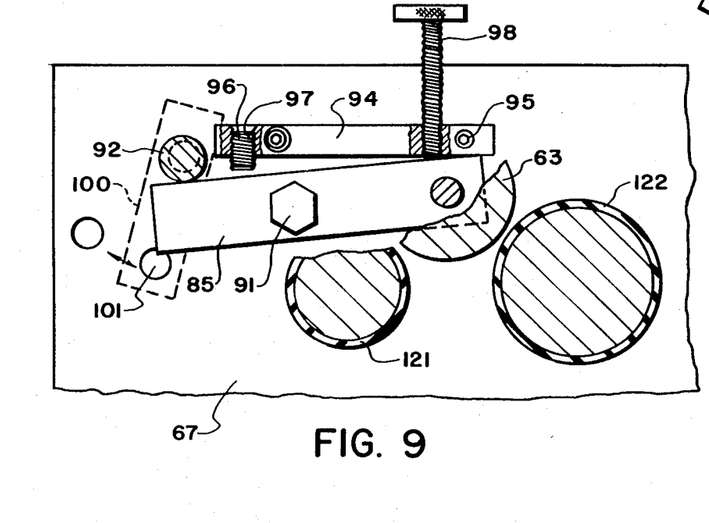
FIG. 9 is an enlarged fragmentary sectional view taken on line 9—9, FIG. 11 with portions broken away, showing the metering roller manual latching mechanism with the metering roller being shown in a noncoating position out of contact with the fountain and coating rollers.
Figure 10:
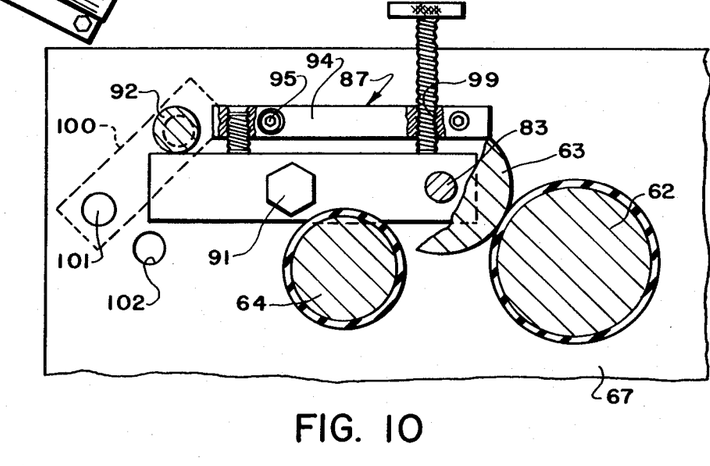
FIG. 10 is a fragmentary diagrammatic view similar to FIG. 9 with the manual latching mechanism shown in an on position and the metering roller in an engaged position with the coating and fountain rollers for coating an offset plate.
Figure 11:
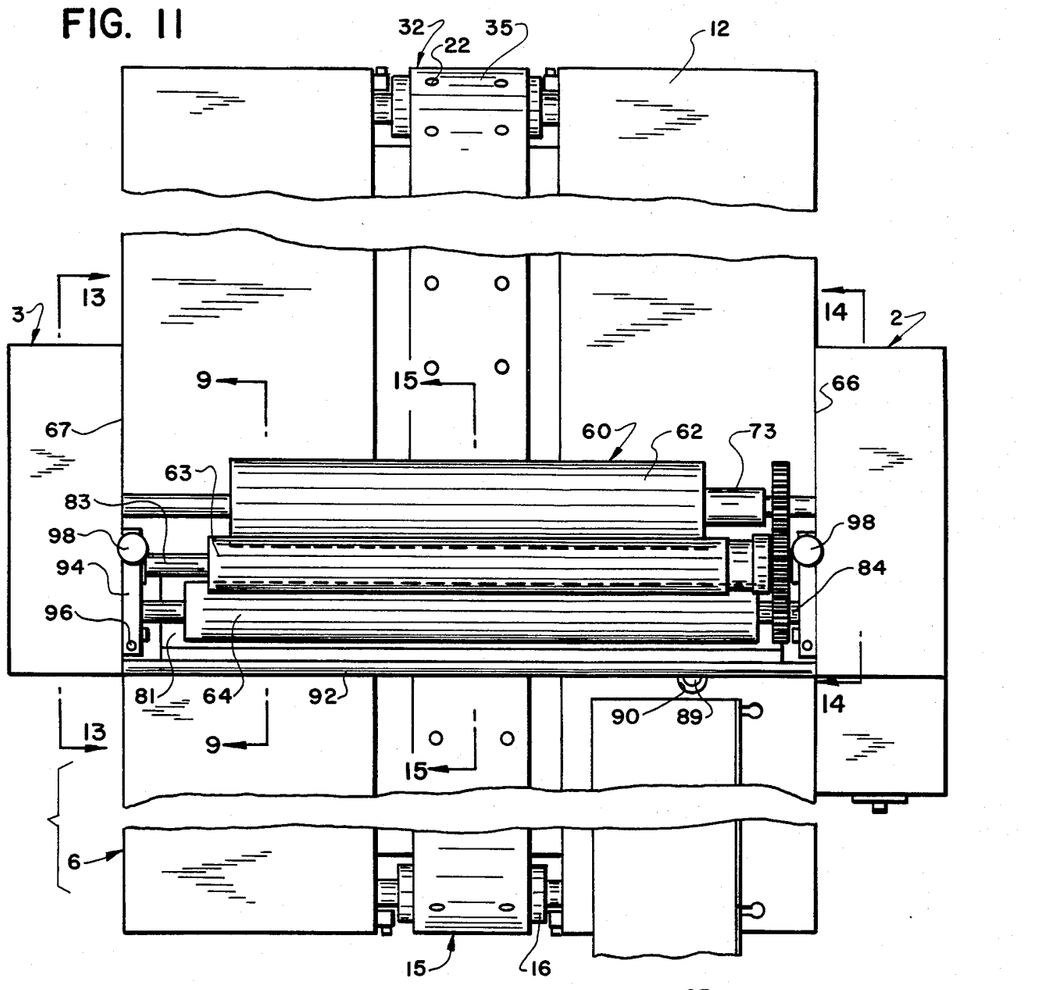
FIG. 11 is an enlarged fragmentary top plan view of the coating roller assembly.

Metering roller 63 includes a pair of stub shafts 83 which are engaged with internal bearings (not shown) for rotatably mounting the roller (FIGS. 11 and 12). Stub shafts 83 are attached to the ends of a pair of latch bars 85 (FIGS. 9, 10 and 12). Latch bars 85 form a part of a latching mechanism indicated generally at 87, which is shown particularly in FIGS. 9 and 10 and described in greater detail below.

Latching mechanism 87 provides a means for manually removing the pressure engagement of metering roller 63 with coating roller 62 and fountain roller 64 when coating device 1 is idle and no coating operation is being performed. Metering roller 63 is rotatably mounted by its stub shafts 83 on the ends of latch bars 85 which are pivotally mounted by bolts 91 on the inside surfaces of end panels 66 and 67, with only end panel 67 being shown in detail in FIGS. 9 and 10. The other ends of latch bars 85 are engaged with an eccentric shaft 92 which extends between end panels 66 and 67 (FIGS. 11 and 12) and which is movably mounted thereon by stub shafts 93.

A fixed positioning bar 94 is mounted on each end panel 66 and 67 and spaced just above latch bar 85 by a pair of bolts 95. A set screw 96 is adjustably mounted in a threaded hole 97 formed in one end of each bar 94 and is engageable with latch bar 85 to limit the upward pivotal movement of bar 85 when pivoted in a clockwise direction as shown in FIGS. 9 and 10 by advancement of a thumb screw 98. Thumb screws 98 are engaged within threaded holes 99 formed in the ends of bars 94 opposite of set screws 96.

Latching mechanism 87 is shown in FIG. 10 in a plate coating operating position in which set screws 96 have been preset with respect to latch bars 85. Thumb screws 98 have been advanced downwardly against latch bars 85 to achieve the desired amount of pressure between metering roller 63 and the coating and fountain rollers 62 and 64, respectively. When coating device 1 is to be idle for any appreciable length of time, a manually operated latch lever 100 (FIG. 13) which is mounted on an end of eccentric stub shaft 93 adjacent end panel 67, is pivotally rotated in a counterclockwise direction (FIGS. 9 and 10). This movement causes eccentric shaft 92 to move the end of latch bars 85 downwardly about pivot bolts 91 pivoting metering roller 63 upwardly and out of engagement with rollers 62 and 64. A spring biased plunger 101 mounted on the end of latch lever 100 will secure latch lever 100 in a latched position by insertion into a hole 102 formed in end panel 67 with metering roller 63 being retained in its raised position of FIG. 9.

To return metering roller 63 to its plate coating position, spring biased plunger 101 is merely withdrawn from its locked position in hole 102 (FIGS. 9 and 10) enabling lever 100 to be pivoted in a clockwise direction enabling latch bars 85 to pivot in a clockwise direction as thumb screws 98 are advanced downwardly into engagement with the latch bars. Set screws 96 form a preset stop to ensure that metering roller 63 is returned to the same position that it occupied prior to being moved out of its pressure engagement with rollers 62 and 64 as thumb screws 98 pivotally move latch bars 85 in a clockwise direction. Thumb screws 98 are advanced only until sufficient pressure is applied to latch bars 85 forcing them securely against set screws 96 to achieve the desired adjusted position.

In accordance with another feature of the invention, the drive mechanism for coating device 1 is synchronized whereby the speed of feed belt 21 and discharge belt 35 are synchronized with the rotational speed of coating roller 62, metering roller 63 and fountain roller 64 in order to achieve a precision uniform coating of the coating liquid on one side of plate 52.

A variable speed drive motor 103 (FIG. 14) is mounted within end cabinet 2 and has a shaft 104 which is connected to a pulley 105 mounted adjacent end panel 66. Pulley 105 provides the driving force for the various drive systems components through a drive belt or chain 106. Drive belt 106 is trained about an idler pulley 107 which also may be mounted on the end of a pump shaft for controlling the flow of coating liquid into reservoir 81. Belt 106 then passes about another pulley 108 which is mounted on the end of shaft 37 of discharge vacuum belt roll 34. Belt 106 continues about another idler pulley 109 and then about a drive pulley 76 which is mounted on the extended end of coating roller shaft 73. Belt 106 then extends about a pulley 110 which is mounted on the end of shaft 19 of feed belt roll 17. Thus, the power for the drive system is supplied by variable speed motor 103 through drive pulley 105 and belt 106. Single drive belt 106 ensures that feed and discharge belt rolls 17 and 34 are driven in synchronization with each other as well as coating roller 62 through shaft 73 and connected pulley 76.

Driven coating roller 62 is synchronized with metering roller 63 and fountain roller 64 by gears which are mounted on the ends of the rollers adjacent end panel 66. Referring to FIG. 12, a gear 111 is mounted on stepped coating roller shaft 73 and meshes with another gear 112 mounted on the end of metering roller 63. Metering roller gear 112 is meshingly drivingly engaged with a third gear 113 mounted on shaft 78 of fountain roller 64. Rotation of coating roller 62 by drive pulley 76 will rotate metering and fountain rollers 63 and 64 in synchronization through the engagement of gears 111, 112 and 113. Thus, the entire drive system, including the speed of feed and discharge belts 21 and 35 and the rotation of rollers 62, 63 and 64, is synchronized to move at the same speed by the interconnection of all of the moving components to achieve the uniform coating which is applied to one side of a moving offset plate 52.

Figure 7:
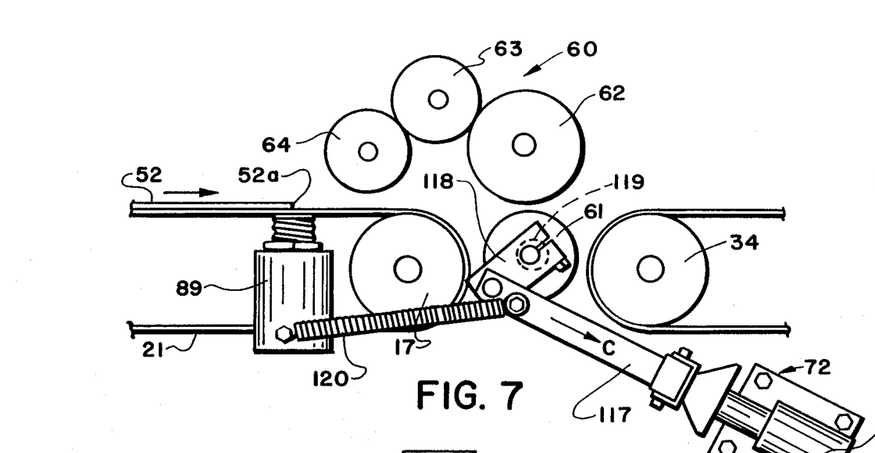
FIG. 7 is a fragmentary diagrammatic side view showing the electromechanical control mechanism for the impression roller, with said roller being shown in a retracted noncoating position.
Figure 8:
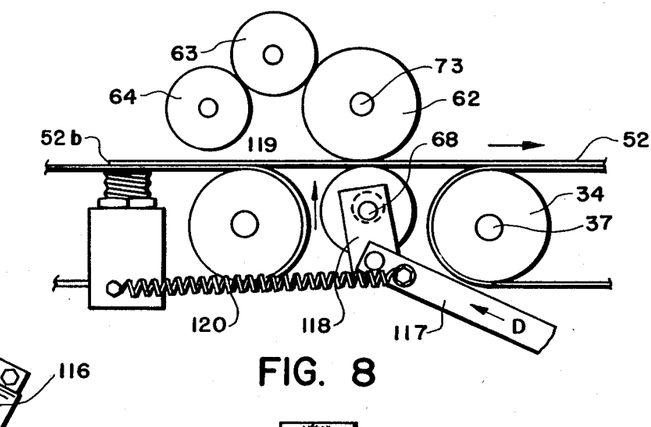
FIG. 8 is a view similar to FIG. 7 showing the impression roller in a forward coating position.

In accordance with one of the main features of the invention, a sensor 89 is mounted in the path of a moving offset plate 52 at the forward edge of plate feed table 6 within a cutout 90 (FIGS. 2 and 11). Sensor 89 is a photoelectric detector, although it could be a limit switch or other type of sensing mechanism, which senses both the leading edge 52a of an offset plate 52 as shown in FIG. 7 as well as the trailing edge 52b of offset plate 52 as shown in FIG. 8.

The remaining components and features of improved coating device 1 will be understood by the following description of the coating application. Manually actuated latching mechanism 87 moves coating roller 63 into the desired preset pressure engagement with coating roller 62 and fountain roller 64 as described above and as shown in FIGS. 9 and 10. A main control switch 115 which is mounted above switches 43 and 59 on end panel 2, is moved to an ON position which energizes main drive motor 103 which starts the various rollers rotating in unison through their gear connection except for impression roller 61 which is in the disengaged retracted position as shown in FIG. 7. Coating liquid from reservoir 81 is carried by fountain roller 64 to metering roller 63 and then to coating roller 62.

Figure 16:
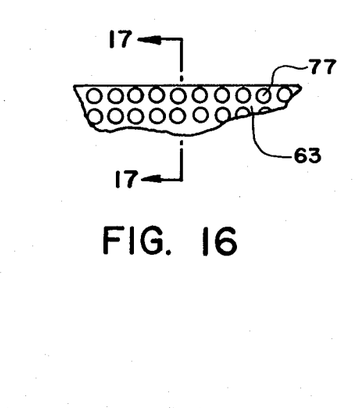
FIG. 16 is a greatly enlarged fragmentary plan view of the metering roller surface.
Figure 17:
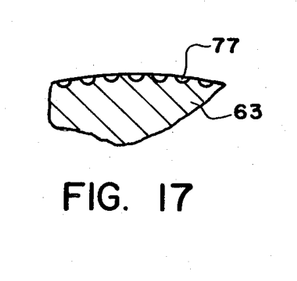
FIG. 17 is a fragmentary sectional view taken on line 17—17, FIG. 16.

As shown in a greatly exaggerated condition in FIGS. 16 and 17, metering roller 63 is an engraved or etched polished metal roller referenced to as an anilox roller, and is formed with a series of wells 77 arranged in a spaced uniform pattern throughout the roller surface. Wells 77 serve to carry a minimum amount of coating which is more than possible with smooth rollers, through the nips of the adjacent rollers and subsequently onto plate 52. These engraved rollers enable the precision amount of coating material to be carried from fountain roller 64 to coating roller 62 and accurately meters and determines the amount of coating liquid which is transferred to coating roller 62 and subsequently to offset plate 52. The particular pattern of well 77 and size thereof, can vary depending upon the particular coating thickness and distribution desired to be applied to the offset plates.

As feed belt 21 advances an offset plate 52 toward coating roller assembly 60, the front edge 52a (FIG. 7) will pass over sensor 89 which detects the passage of the plate edge and through the appropriate electrical circuitry shown in FIG. 18 and described in detail below, energizes electromechanical pressure mechanism 72 after a predetermined time delay. At the desired instant of time, solenoid 116 is energized which moves arm 117 in the direction of arrow C (FIG. 7) which pivots lever 118 in a counterclockwise direction moving impression roller 61 upwardly toward coating roller 62 by an eccentric 119 mounted on impression roller shaft 68 and operatively connected to lever 118. The actuation of solenoid 116 and correspondingly movement of impression roller 61 is timed with the passage of plate front edge 52a so that impression roller 61 presses plate 52 against coating roller 62 as shown in FIG. 8 immediately after the passage of plate edge 52a beneath coating roller 62, whereby the liquid coating will be applied to the top surface of plate 52 by roller 62 at the desired position which generally will be immediately rearwardly of front edge 52a. This mechanism enables the coating to be applied starting at a predetermined line on the plate without any of the coating material being transferred to impression roller 61 and subsequently to the underside surface of plate 52.

The coating application continues to be applied to the top side only of plate 52 as it is moved along between the nip of impression roller 61 and coating roller 62 by the synchronized movement of feed belt 21 and discharge belt 35 together with the pressure exerted by roller 61 and 62 until the trailing edge 52b passes over sensor 89. Sensor 89 detects the passage of trailing edge 52b and after a predetermined time interval, de-energizes solenoid 116. A spring 120 will then move arm 117 in the direction of arrow D (FIG. 8) which will move impression roller 61 downwardly and away from coating roller 62 which will disengage plate 52 from contact with coating roller 62 preventing any coating liquid from being transferred thereto. The time delay is set to ensure that the remaining area of plate 52 is coated except for possibly a very small strip adjacent trailing edge 52b. Solenoid 116 will remain de-energized with impression roller 61 being retained by spring 120 in its retracted position until sensor 89 senses leading edge 52a of another offset plate 52 whereupon the solenoid will be energized moving impression roller 61 toward coating roller 62 for the start of another plate coating application.

Fountain roller 64 and coating roller 62 preferably will have an outer layer or covering 121 and 122 (FIGS. 9 and 10) of a soft resilient material in contrast to the hard steel outer surfaces of impression roller 61 and metering roller 63. These alternating relatively soft and hard roller surfaces have been found to provide a better and more uniform transfer of coating liquid from reservoir 81 to offset plate 52.

In accordance with still another feature of the invention, rollers 62-64 of roller assembly 60 are offset longitudinally with respect to each other as shown in FIG. 11 with fountain roller 64 having the greatest longitudinal length with respect to intermediate length metering roller 63 and the smallest length coating roller 62. This arrangement prevents any undesirable bead of coating material from forming at the two ends of the coating roller and subsequently being transferred to offset plate 52. Fountain roller 64 being longer than metering roller 63 reduces the formation of these edge beads on metering roller 63, which formation is further reduced when the liquid is transferred to coating roller 62 by forming coating roller 62 shorter than metering roller 63. By providing these rollers with the staggered lengths, the end of the coating roller will have an acceptable minimum bead that is ultimately transferred to offset plate 52. Also, coating roller 62 may be narrower than the width of the offset plate being coated providing further economy in the plate coating material if desired.

Figure 18:
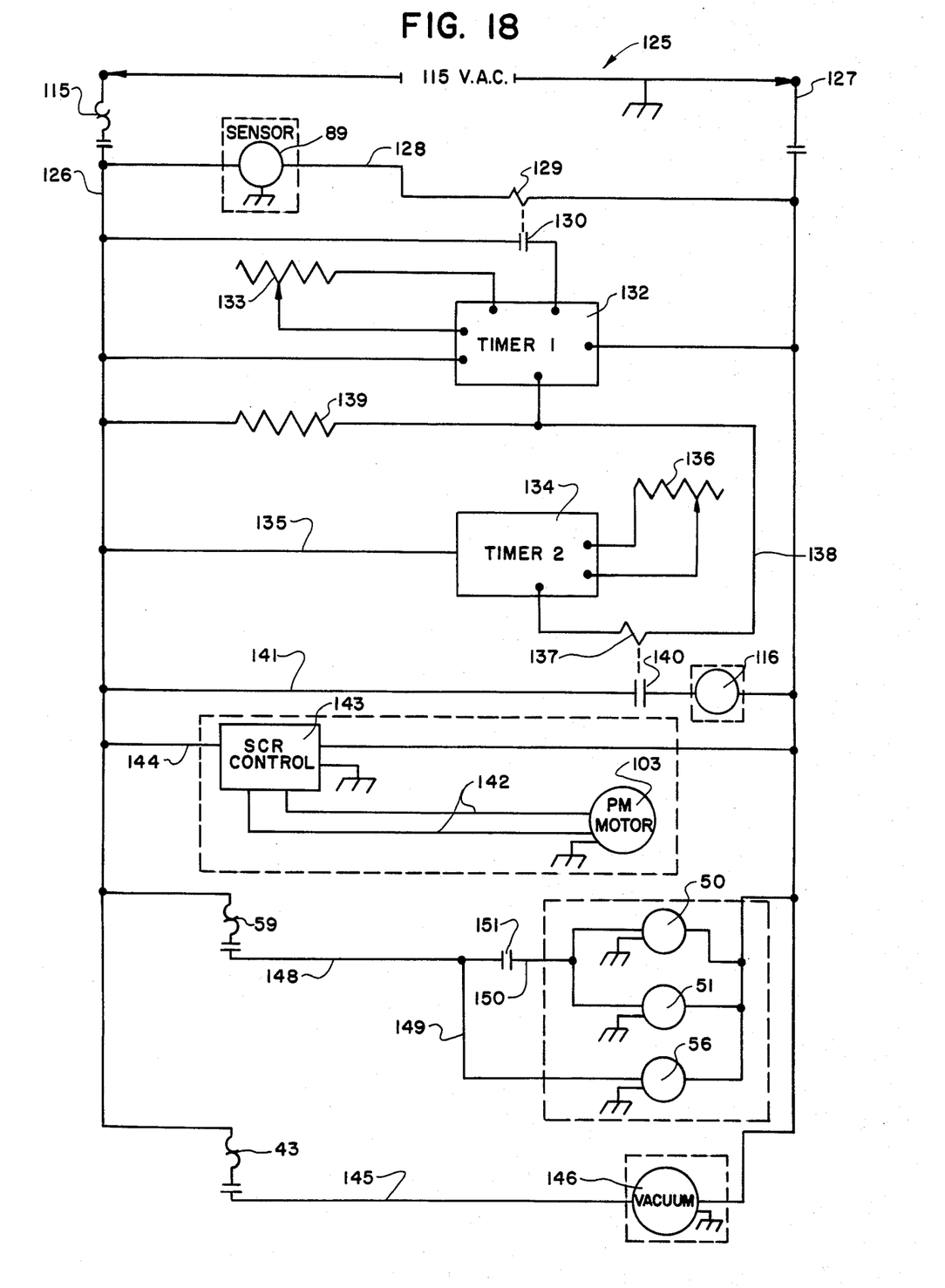
FIG. 18 is a schematic wiring diagram of the electrical controls for the improved coating device.

FIG. 18 shows a schematic wiring diagram of one type of electrical system which may be used for improved coating device 1. The electrical control system indicated generally at 125 (FIG. 18), includes the two main conductors 126 and 127 which are connected to a source of 115 volts AC. Sensor 89 and a control relay 129 which is actuated by sensor 89 are connected to main power conductor 126 and 127 by a branch line 128. Contacts 130 of relay 129 are connected by a branch line 130 to a first timer 132. Timer 132 is adjustable by a variable resistor 133. A second timer 134 is connected to first timer 132 and the main power conductors by a branch line 135 and is adjustable by a variable resistor 136. Timer 134 controls another power relay 137 connected to timer 134 by line 138 and contains a protective resistor 139. Relay contacts 140 of relay 137 are mounted in branch line 141 for controlling solenoid 116 which also is mounted in line 141.

Drive motor 103 of the belt drive system is connected by lines 142 to an SCR control 143 which enables the speed of motor 103 to be accurately and easily adjusted. SCR control 143 is connected across the 115 volt power source by another branch line 144. Switch 43 which controls the suction or vacuum system for drive belt 21 and discharge belt 35 is mounted in a branch line 145 which is connected with a vacuum motor 146. Switch 59 for the drying and exhaust systems is mounted in a branch line 148 and is connected directly to the exhaust motor 56 through a line 149. Air impinging motors 50 and 51 of dryer system 45 are connected to branch line 148 by a line 150 containing a second set of power relay contacts 151 which are controlled by relay 137.

The operation of electrical control system 125 is described briefly below. Upon sensor 89 detecting the passage of plate front edge 52a, control relay 129 is energized closing contacts 130 which starts first timer 132. The timing period of timer 132 is adjusted by adjustable resistor 133. After passage of the predetermined time period set by timer 132, relay contacts 140 are closed energizing solenoid 116 which moves impression roller 61 into coating engagement with the underside surface of plate 52 as described above and shown in FIG. 7. It is understood that prior to this operation main control switch 115 located in main power line 126 has been moved to the ON position as well as switches 43 and 59 for energizing vacuum producing motor 146 and air impinging motors 50 and 51 and exhaust blower motor 56.

When sensor 89 senses trailing edge 52b of offset plate 52, timer 134 is started and after passage of the preset time period will actuate relay 137 to open contacts 140 and de-energize solenoid 116 enabling spring 120 to retract impression roller 61 from its coating position with coating roller 62. Actuation of relay 137 by timer 134 also will actuate contacts 151 to deenergize dryer blower motors 50 and 51 to prevent the trailing edge of plate 52 from lifting upwardly from its flat engaged position with discharge belt 35.

Motor 103 is a DC drive motor controlled by SCR 143 which enables the motor speed and correspondingly the roller speeds and belt speeds to be accurately controlled further increasing the ability of coating device 1 to achieve an extremely efficient application of a desired coating control liquid by roller assembly 60 onto the top surface of offset plate 52.

In accordance with another feature of the invention, plate feed table 6 and discharge table 7 may be pivotally mounted by pivots 152 and 153 respectively, to enable the feed table and belt drive system therefor and the plate discharge table and drive system, to be pivoted from their normal horizontal operating position as shown in full lines in FIG. 4 downwardly to a retracted position as shown by dot-dash lines in FIG. 4. This enables coating device 1 to be moved easily through doorways and narrow passageways for installation at the printing plant and also enables the feed and discharge tables to be retracted when the coating device is not to be used for an extended period of time providing a compact unit which saves space thereby increasing its versatility.

The particular details of construction and mode of operation described above is for the preferred embodiment shown. However, the invention should not be limited to this exact construction and operation since it is easily seen that other modifications can be made without affecting the concept of the invention. For example, coating roller 62 may be eliminated and the engraved or metering roller can coat the plate directly without transferring the metered coating liquid from the metering roller to the coating roller. Also, a doctor blade may be used on the engraved roller or in place of the particular etched roller described above in order to achieve the desired amount of liquid coating transferred to the coating roller.

Although the rollers are indicated as being driven in unison, the surface speeds thereof may be different by changing the diameters of the rollers to achieve various coating characteristics. Also, the device can be oriented to coat plates face down as well as at angles including the horizontal coating thereof as shown in the drawings and described above. Also, the plates may be recoated more than once for applying coating layers to achieve the desired thickness. Likewise, dyes of various types can be used in the coating solution or for different layers for achieving contrast of images and background of the matter to be printed on the plates.

Other types of drying means can be used instead of the air impinging blowers, for example, infrared heat lamps. The particular drying means will depend somewhat on the particular coating material being used to ensure safety to the machine operators due to possible harmful vapors or explosion if too hot of drying temperature is used with a particular coating material. This drying feature is desirable in that the plate coating has dried sufficiently by the time the plate reaches the end of the discharge table, enabling the plate to be discharged directly into a collection bin or table located immediately adjacent discharge belt 35, permitting the coated plates to be stacked one upon the other without the coating being transferred to the bottom side of the adjacent plate.

Accordingly, the improved plate coating device is simplified, provides an effective, safe, inexpensive, and efficient device which achieves all the enumerated objectives, provides for eliminating difficulties encountered with prior devices, and solves problems and obtains new results in the art.

In the foregoing description, certain terms have been used for brevity, clearness and understanding; but no unnecessary limitations are to be implied therefrom beyond the requirements of the prior art, because such terms are used for descriptive purposes and are intended to be broadly construed.

Moreover, the description and illustration of the invention is by way of example, and the scope of the invention is not limited to the exact details shown or described.

Having now described the features, discoveries and principles of the invention, the manner in which the improved plate coating device is constructed and used, the characteristics of the construction, and the advantageous, new and useful results obtained; the new and useful structures, devices, elements, arrangements, parts, and combinations, are set forth in the appended claims.

What is claimed is:

1. An improved device for coating offset plates including:
    (a) coating roller means adapted to communicate with a supply of coating liquid for transferring said coating liquid to one side of an offset plate, said coating roller means including a fountain roller in communication with the supply of coating liquid, a coating roller for transferring the coating liquid onto an offset plate and a metering roller engageable with the fountain roller and coating roller for transferring a predetermined amount of coating liquid from the coating liquid supply to the offset plate;
    (b) drive means for rotatably driving the coating roller means for transferring said coating liquid from the liquid supply to one side of an offset plate;
    (c) feed means for delivering an offset plate into the coating roller means to be coated by said roller means;
    (d) sensor means for detecting the position of an offset plate with respect to the coating roller means as it is being moved by the feed means; and
    (e) coating control means responsive to the sensor means for moving the offset plate into and out of coating engagement with the coating roller means for applying coating liquid to a predetermined portion of only one side of said plate, said coating control means means including an impression roller for providing pressure against the uncoated side of the offset plate as the coating roller applies the coating liquid to said one side of the plate, and an eccentric shaft rotatably mounting the impression roller and a solenoid actuated arm for controlling movement of the eccentric shaft to move the impression roller toward and away from the coating roller to move an offset plate into and out of coating engagement with the coating roller.

2. The coating device defined in claim 1 in which the metering roller is formed with a plurality of engraved wells for transferring a predetermined amount of coating liquid from the fountain roller to the coating roller.

3. The coating device defined in claim 2 in which the engraved wells are of a uniform size and are dispersed uniformly throughout the roller.

4. The coating device defined in claim 1 in which the outer surfaces of the coating roller and fountain roller are softer than the outer surfaces of the metering roller and impression roller.

5. The coating device defined in claim 1 in which the fountain roller is longer in the axial direction than the metering roller; and in which the metering roller is longer in axial length than the coating roller.

6. The coating device defined in claim 1 in which a spring biases the eccentric shaft of the impression roller away from pressure engagement with an offset plate and coating roller.

7. The coating device defined in claim 1 in which the feed means includes a rotatably mounted endless belt and drive means for rotating said belt to move an offset plate engaged by said belt into the coating roller means.

8. The coating device defined in claim 7 in which the endless belt drive means includes a pair of spaced rolls around which the endless belt extends; and in which one of said rolls is driven by a drive belt which also forms part of the drive means for the coating roller means whereby the movement of the roller means and endless belt of the feed means are synchronized.

9. The coating device defined in claim 7 in which the endless belt is formed with a plurality of holes; and in which a suction chamber is in communication with the belt and creates a suction force through the belt holes to retain an offset plate on the belt for moving the plate into the coating roller means.

10. The coating device defined in claim 7 in which the feed means further includes a feed table on which an offset plate is slidably supported; and in which the endless belt extends along a central portion of the feed table for slidably moving a plate along said table and into the coating roller means.

11. The coating device defined in claim 1 in which discharge means is located on the downstream side of the coating roller means opposite of the feed means for transferring an offset plate from the roller means to a collection area after being coated on one side thereof.

12. The coating device defined in claim 11 in which the discharge means includes a discharge table for slidably supporting an offset plate and a power driven endless belt which moves the coated offset plate along the discharge table toward the collection area.

13. The coating device defined in claim 11 in which the feed means includes a feed table for slidably supporting an offset plate and a power driven endless belt which moves the plate along the feed table and into the coating roller means; and in which the drive means for the coating roller means is operatively connected with the endless belt of the feed means and discharge means for synchronizing movement of said belts with the rotation of the coating roller means.

14. The coating device defined in claim 13 in which the feed table and discharge table are pivotally mounted with respect to the coating roller means for placing the device in a partially collapsed position.

15. The coating device defined in claim 1 in which drying means is located on the downstream side of the coating roller means closely adjacent to said roller means, for drying the coating liquid after being applied to the one side of a plate.

16. The coating device defined in claim 15 in which the drying means includes an air impinging blower which blows air on the coated side of the plate for drying the coating liquid.

17. The coating device defined in claim 15 in which exhaust means is located on the downstream side of the drying means for collecting and venting any vapors discharged by the coating liquid after being applied to the offset plate.

18. The coating device defined in claim 1 in which the drive means for the coating roller means includes a variable speed electric motor, and motor control means for adjusting the speed of the coating roller means to adjust the thickness of the liquid coating applied to the offset plate.

19. The coating device defined in claim 1 in which the sensor means includes a photoelectric sensor located in the path of an offset plate as it is moved by the feed means toward the coating roller means; and in which said sensor detects passage of the leading and trailing edges of the offset plate for controlling the responsive means.

20. The coating device defined in claim 1 in which the metering roller is pivotally mounted and is moved into and out of pressure engagement with the fountain roller and coating roller when applying coating liquid to a plate; and in which latch means is engaged with the metering roller for returning the metering roller out of pressure engagement with the fountain roller and coating roller when the coating device is de-energized.

21. The coating device defined in claim 20 in which the metering roller is rotatably mounted on pivot bars located at both ends of said roller; in which the latch means includes a manually operated lever engageable with one of the pivot bars for pivotally moving the metering roller with respect to the fountain and coating rollers.

22. The coating device defined in claim 21 in which adjustable stop means is engageable with the pivot bars for retaining the same pressure relationship with the fountain and coating rollers after operation of the latch means.

* * * * *